US011676951B2

(12) United States Patent
Koduri et al.

(10) Patent No.: US 11,676,951 B2
(45) Date of Patent: Jun. 13, 2023

(54) PACKAGE FOR POWER SEMICONDUCTOR DEVICES

(71) Applicant: Texas Instruments Incorporated, Dallas, TX (US)

(72) Inventors: Sreenivasan K. Koduri, Dallas, TX (US); Steven R. Tom, Dallas, TX (US); Paul Brohlin, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 266 days.

(21) Appl. No.: 17/219,123

(22) Filed: Mar. 31, 2021

(65) Prior Publication Data

US 2022/0208745 A1 Jun. 30, 2022

Related U.S. Application Data

(60) Provisional application No. 63/133,157, filed on Dec. 31, 2020.

(51) Int. Cl.
| | |
|---|---|
| *H01L 23/48* | (2006.01) |
| *H01L 21/56* | (2006.01) |
| *H01L 25/16* | (2023.01) |
| *H01L 23/498* | (2006.01) |
| *H01L 23/13* | (2006.01) |
| *H01L 21/48* | (2006.01) |

(Continued)

(52) U.S. Cl.
CPC .......... *H01L 25/16* (2013.01); *H01L 21/4846* (2013.01); *H01L 23/13* (2013.01); *H01L 23/49838* (2013.01); *H01L 25/162* (2013.01); *H01L 23/3121* (2013.01); *H01L 23/367* (2013.01); *H01L 23/3735* (2013.01); *H01L 23/3736* (2013.01); *H01L 24/48* (2013.01); *H01L 24/49* (2013.01); *H01L 2224/48137* (2013.01); *H01L 2224/48225* (2013.01); *H01L 2224/49175* (2013.01)

(58) Field of Classification Search
CPC ....... H01L 21/4846; H01L 23/13–3736; H01L 25/16; H01L 2224/48137–49175
See application file for complete search history.

(56) References Cited

U.S. PATENT DOCUMENTS

| | | | |
|---|---|---|---|
| 10,199,312 B1 * | 2/2019 | Rivera-Marty | ..... H01L 21/4828 |
| 2016/0027722 A1 * | 1/2016 | Lopez | ............... H01L 23/49541 |
| | | | 257/676 |
| 2019/0131682 A1 * | 5/2019 | Cook | ........................ H01P 3/10 |

* cited by examiner

*Primary Examiner* — Hoa B Trinh
(74) *Attorney, Agent, or Firm* — Dawn Jos; Frank D. Cimino (57) ABSTRACT

In a described example, an apparatus includes: a first mold compound partially covering a thermal pad that extends through a pre-molded package substrate formed of a first mold compound, a portion of the thermal pad exposed on a die side surface of the pre-molded package substrate, the pre-molded package substrate having a recess on the die side surface, with an exposed portion of the thermal pad and a portion of the first mold compound in a die mounting area in the recess; a semiconductor die mounted to the thermal pad and another semiconductor die mounted to the mold compound in the die mounting area; wire bonds coupling bond pads on the semiconductor dies to traces on the pre-molded package substrate; and a second mold compound over the die side surface of the pre-molded package substrate and covering the wire bonds, the semiconductor dies, the recess, and a portion of the traces.

20 Claims, 10 Drawing Sheets

(51) Int. Cl.
*H01L 23/373* (2006.01)
*H01L 23/31* (2006.01)
*H01L 23/00* (2006.01)
*H01L 23/367* (2006.01)

PACKAGE FOR POWER SEMICONDUCTOR DEVICES

CROSS REFERENCE TO RELATED APPLICATIONS

This application claims the benefit of and priority to U.S. Provisional Application No. 63/133,157, filed Dec. 31, 2020 which is hereby incorporated herein by reference in their entirety.

TECHNICAL FIELD

This relates generally to packaging electronic devices, and more particularly to packaging for semiconductor devices for power applications.

BACKGROUND

For semiconductor devices produced for power applications, a package for the semiconductor devices needs to dissipate substantial thermal energy, while at the same time, the package must be compatible with currents of several amperes, and voltages of up to thousands of Volts, and have low inductance. Recent power semiconductor technology devices include field effect transistors (FETs) for power applications fabricated in Gallium Nitride (GaN-FET) and Silicon Carbide (SiC) technologies, as well as advanced lateral metal-oxide-semiconductor (MOS) FETs. These devices have capabilities that exceed the capabilities of prior power FET devices, for example having lower on-resistance from drain to source (Rdson) and higher breakdown voltages. The resulting power transistors can safely carry high currents at high voltages. When these power FET devices are mounted in a semiconductor package, the performance of the packaged devices is sometimes constrained not by the capabilities of the semiconductor devices, but instead by the ability of the package to dissipate heat or withstand the power that the semiconductor device is capable of carrying. Increasingly these power transistors and associated circuits are integrated together into a packaged unit containing several semiconductor dies to provide commonly used power circuits, such as half bridge circuits. In packages where multiple semiconductor dies are mounted together, electrical isolation between some of the devices is often needed. Packages for power devices must provide good thermal dissipation, high switching slew rates, low parasitic inductance, and electrical isolation for some components. In high voltage devices, in the package certain distance clearances must be maintained to avoid arcs, or shorts between metal features. Prior package approaches have limited thermal transfer capabilities, high inductance, or both. Packages that enable the full performance of integrated power devices are needed.

SUMMARY

In an example an apparatus includes: a first mold compound partially covering a thermal pad that extends through a pre-molded package substrate formed of a first mold compound, the thermal pad having an exposed surface on a backside surface of the pre-molded package substrate, a portion of the thermal pad exposed on a die side surface of the pre-molded package substrate opposite the backside surface, the pre-molded package substrate having a recess on the die side surface, with an exposed portion of the thermal pad and a portion of the first mold compound in a die mounting area in the recess; a semiconductor die mounted to the thermal pad and another semiconductor die mounted to the mold compound in the die mounting area; conductive traces overlying the mold compound on the die side surface of the pre-molded package substrate and spaced from the recess; wire bonds coupling bond pads on the semiconductor dies to the traces; and a second mold compound over the die side surface of the pre-molded package substrate and covering the wire bonds, the semiconductor dies, the recess, and a portion of the traces.

DETAILED DESCRIPTION

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or can include active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs). The semiconductor device can be a micro electro-mechanical system (MEMS) device, such as a digital micromirror device (DMD). Semiconductor dies for power applications include a discrete power transistor, a gate driver to operate the power transistor, passives such as capacitors, inductors, and resistors needed to implement power circuitry, and intelligent power devices that include protective sensors such as inrush current sensors that add reliability and control to the system. In some applications, these devices may be fabricated of different semiconductor materials, and can be separate semiconductor dies that are mounted in a single device package.

The term "packaged electronic device" is used herein. A packaged electronic device has at least one semiconductor die electronically coupled to terminals and has a package body that protects and covers the semiconductor die. In some arrangements, multiple semiconductor dies can be packaged together. For example, a power metal oxide semiconductor (MOS) field effect transistor (FET) semiconductor die and a second semiconductor die (such as a gate driver die or controller device die) can be packaged together to from a single packaged electronic device. Additional components such as passives can be included in the packaged electronic device. The semiconductor die is mounted to a package substrate that provides conductive leads, a portion of the conductive leads form the terminals for the packaged electronic device. The semiconductor die can be mounted to the package substrate with an active device surface facing away from the package substrate and a backside surface facing and mounted to the substrate. Alternatively, the semiconductor die can be flip-chip mounted with the active surface facing the substrate surface, and the semiconductor die is mounted to the leads of the substrate by conductive columns or solder balls. The packaged electronic device can have a package body formed by a thermoset epoxy resin in a molding process, or by the use of epoxies, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device.

The term "package substrate" is used herein. A package substrate is a substrate arranged to receive a semiconductor die and to support the semiconductor die in a completed semiconductor package. Package substrates include conductive lead frames, which can be formed from copper, aluminum, stainless steel and alloys such as Alloy 42 and copper alloys. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. In the arrangements, a pre-molded package substrate includes a thermal pad incorporated into a dielectric material, the thermal pad has surfaces exposed from the dielectric material to facilitate thermal transfer, and has surfaces exposed in a die mount area to enable semiconductor dies to be mounted directly on the thermal pad, further facilitating thermal transfer.

In this description the term "pre-molded package substrate" is used. A "pre-molded package substrate" is a package substrate that includes at least one thermal pad that has a backside surface exposed from a mold compound that partially covers and contains the thermal pad. In example arrangements the thermal pad is a metal and is a monolithic piece of metal, in the example arrangements described herein the metal is copper. Other conductive materials and other metals can be used. In additional arrangements the thermal pad is a first thermal pad and a second thermal pad of a thermally conductive ceramic may be used and is in contact with the first thermal pad. The thermal pad has a surface exposed in a recess in the mold compound on a die side surface of the pre-molded package substrate for mounting one or more semiconductor dies. The recess in the pre-molded package substrate also has a surface of the mold compound for mounting one or more semiconductor dies that are electrically isolated from the thermal pad. The pre-molded package substrate has traces over the die side surface spaced from the recess, the traces can be used to electrically connect the semiconductor dies to form circuits. A portion of the traces on the pre-molded package substrate will form leads of a device package.

The term "quad flat no-lead" or "QFN" is used herein for a device package. A QFN package has leads that are coextensive with the sides of a molded package body and the leads are on four sides. Alternative flat no-lead packages may have leads on two sides or on one side. These can be referred to as "small outline no-lead" or "SON" packages. No lead packaged electronic devices can be surface mounted to a board. Leaded packages can be used with the arrangements where the leads extend away from the package body and are shaped to form a portion for soldering to a board. A dual in line package, or DIP, can be used with the arrangements.

In the arrangements, the problem of providing a package for power semiconductor devices is solved by use of a pre-molded package substrate with a thermal pad extending through the pre-molded package substrate and surrounded by a dielectric. A portion of the thermal pad is exposed from mold compound on a die side surface for mounting semiconductor dies. One or more semiconductor dies are mounted on the thermal pad so that the semiconductor dies are in thermal contact with the thermal pad. The thermal pad has a backside surface exposed from the mold compound. When the package is surface mounted to a system board, the backside surface of the thermal pad faces away from the system board. The exposed backside surface of the thermal pad is configured in some arrangements to have an external heat sink mounted to it. The pre-molded package substrate has die mounting areas that may be in electrical contact with the thermal pad, and additional die mounting areas that are electrically insulated from the thermal pad. The pre-molded package substrate has conductive leads formed over the mold compound. The pre-molded package substrate has a recess formed in the mold compound for mounting the semiconductor dies. The leads and the semiconductor dies can be connected using wire bonds or ribbon bond connections to form an integrated circuit solution. The pre-molded package substrate, the semiconductor dies, and the electrical connections may be assembled and then encapsulated with another dielectric to protect the circuitry and complete the package. Portions of the leads are left exposed from the mold compound to form terminals for the package device and enable surface mount of the packaged device to a board or module.

Figure 1:
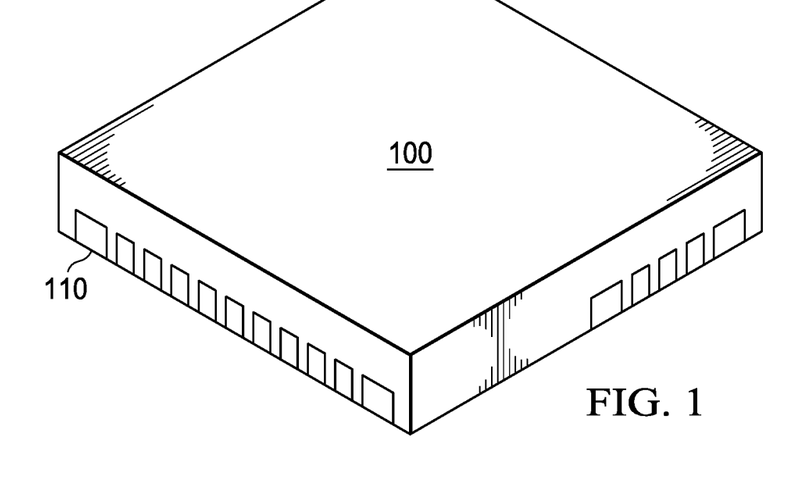
FIG. 1 is a projection view of a flip-chip packaged electronic device in a quad flat no-leads (QFN) package.

FIG. 1 illustrates a packaged electronic device 100 in a quad flat no lead (QFN) package. The packaged electronic device 100 has a body that may be formed from a thermoset mold compound, such as epoxy resin. Other mold compounds, such as resins, epoxies, or plastics can be used. Ceramics and other polymers can be used. Leads 110 are part of a package substrate that supports a semiconductor die (not visible, as it is obscured by the package 100) within the package, the leads 110 are exposed from the mold compound and form electrical terminals for the packaged device. The packaged electronic device 100 can be mounted to a circuit board using surface mount technology (SMT). Package sizes are continually decreasing, and currently can be several millimeters on a side to less than one millimeter on a side, although larger and smaller sizes are also used. Future package sizes will be smaller than one millimeter on a side as semiconductor devices continue to be smaller. The QFN package is increasingly used to package semiconductor devices, it has advantages (when compared to other package types) in that the leads are formed within the boundary of the package body, so that the QFN package makes efficient use of system board area compared to leaded packages. However, the QFN package 100 dissipates heat from the package into the system board. This can both limit thermal transfer from the packaged device 100 and can create hot spots or cause thermal limits on the board. In some systems packaged power devices may heat the board and may heat other devices mounted on the board, limiting performance.

Figure 2A:
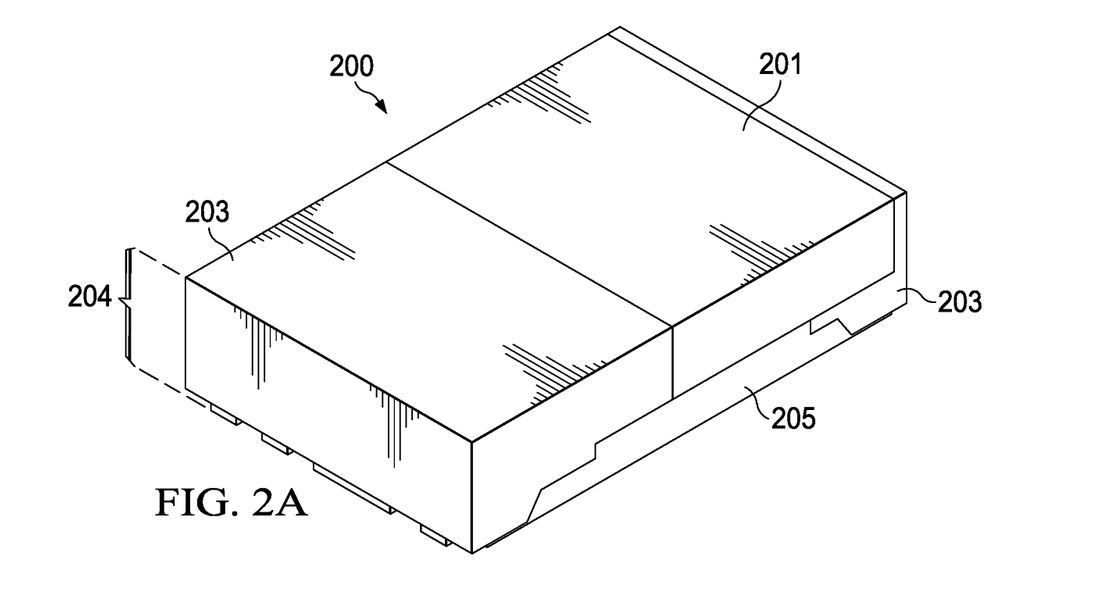
FIGS. 2A-2B illustrate in projection views a package of the arrangements.

FIGS. 2A-2B illustrate in projection views an electronic device package of the arrangements. In FIG. 2A package 200 is shown in a projection view looking towards a backside surface, away from an opposing die side surface. Package 200 has a pre-molded package substrate 204 with a thermal pad 201. The thermal pad 201 has several surfaces exposed for thermal dissipation, including the backside surface, and the pre-molded package substrate 204 includes the thermal pad 201 and a first mold compound portion 203 that covers at least part of thermal s pad 201 and forms a portion of the package 200. A second mold compound 205 covers a recess extending into a die side surface of the pre-molded substrate 204, where semiconductor dies (not visible in FIG. 2A) are mounted.

Figures 2B, 3A:
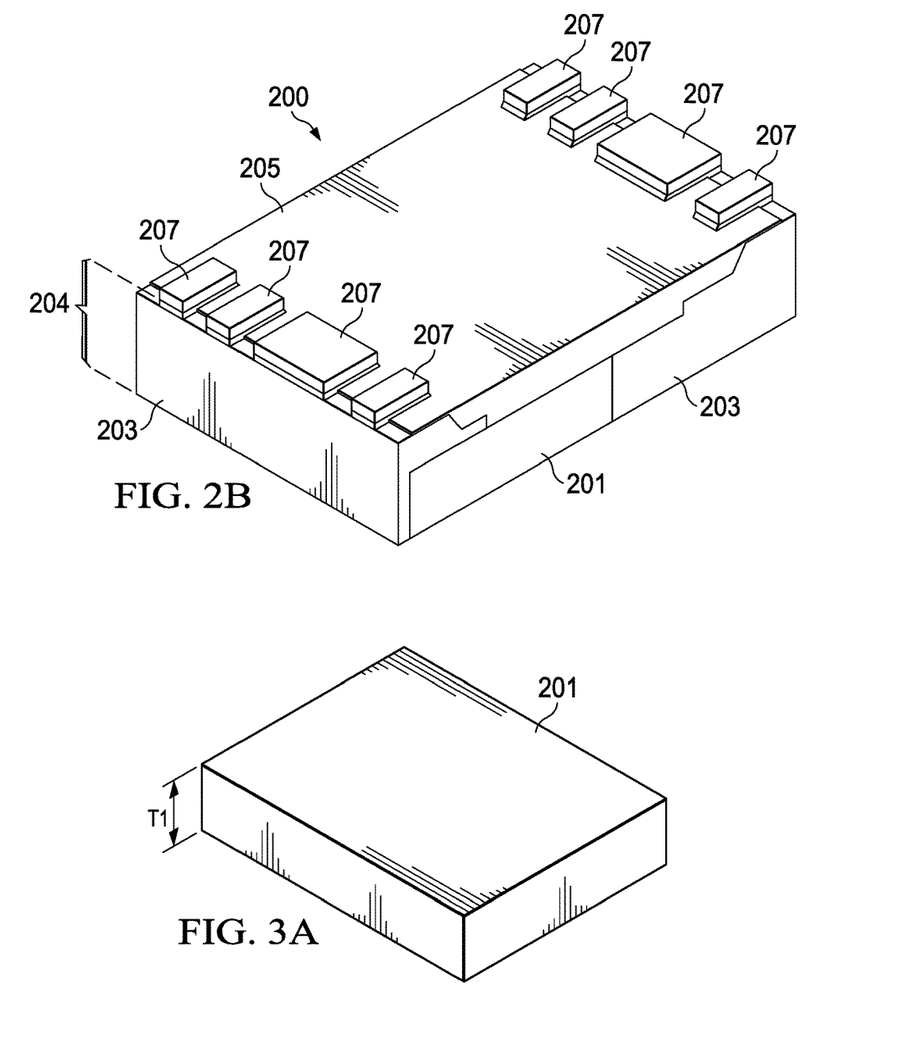
FIGS. 3A, 3AA, 3B, 3BB, 3C, 3CC, and 3D-3H illustrate in a series of steps a method for forming packaged electronic devices of an arrangement.

In FIG. 2B, the package 200 is shown in another projection view from the die side surface of the package. Thermal pad 201, first mold compound portion 203, and second mold compound portion 205 are again shown. The thermal pad 201 can be copper. In other useful arrangements, the thermal pad can be a thermally conductive material, such as aluminum, steel, stainless steel, nickel, or Alloy 42. The pre-molded package substrate 204 includes conductive traces on the die side surface. A portion of these traces are exposed from mold compound 205 and form package leads 207, these leads are arranged for mounting to a system board or module using surface mount technology (SMT). The semiconductor die or dies are not visible but are mounted on the die side surface of the pre-molded package substrate 204 and are covered by second mold compound 205. In the arrangements, the thermal path is from the die side surface of the pre-molded package substrate 204 and through the thermal pad 201 that extends through the package 200 to the backside surface of package 200. A system board that the package 200 is mounted on is therefore not required to provide thermal dissipation for the package 200, and in addition, as is described further below, heat sinks, forced air, liquids, convection and other cooling techniques can be used to further increase thermal dissipation.

FIGS. 3A, 3AA, 3B, 3BB, 3C, 3CC, and FIGS. 3D-3G illustrate in a series of steps a method for forming packaged electronic devices. In FIG. 3A, a thermal pad 201 is shown in a projected view. This thermal pad 201 forms both a semiconductor die support and a thermal dissipation path for the arrangements. The thermal pad has a thickness T1 that will vary with the application and the package being formed, but can range from 100 microns to 1500 microns. The thickness of the thermal pad is determined by the needs of the application, that is, the power rating the package has to support. In an example pre-molded package substrate the thickness T1 was 600 microns. In some examples, the thermal pad 201 is a monolithic metal. In some examples, the metal is copper. As described above, another thermally conductive material or another metal can be used. In FIG. 3AA, an alternative thermal pad 202 for use with the pre-molded package substrate is shown after being shaped. Various shapes can be formed using etching, stamping, grinding or milling on copper, gold, aluminum, stainless steel, nickel, Alloy 42 or another metal to form the thermal pad 201 or 202. When copper is used, the copper may be plated at various stages in the process with materials to enhance solderability and reduce corrosion, reduce tarnish or prevent copper ion diffusion. Useful platings may include gold, silver, tin, nickel, palladium, platinum, and combination platings including electroless nickel immersion gold (ENIG) and electroless nickel, electroless palladium, immersion gold (ENEPIG) plating systems.

Figure 3:
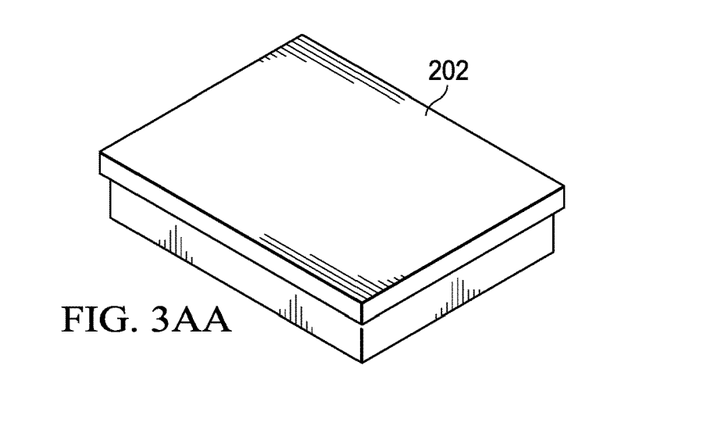
Figure 3B:
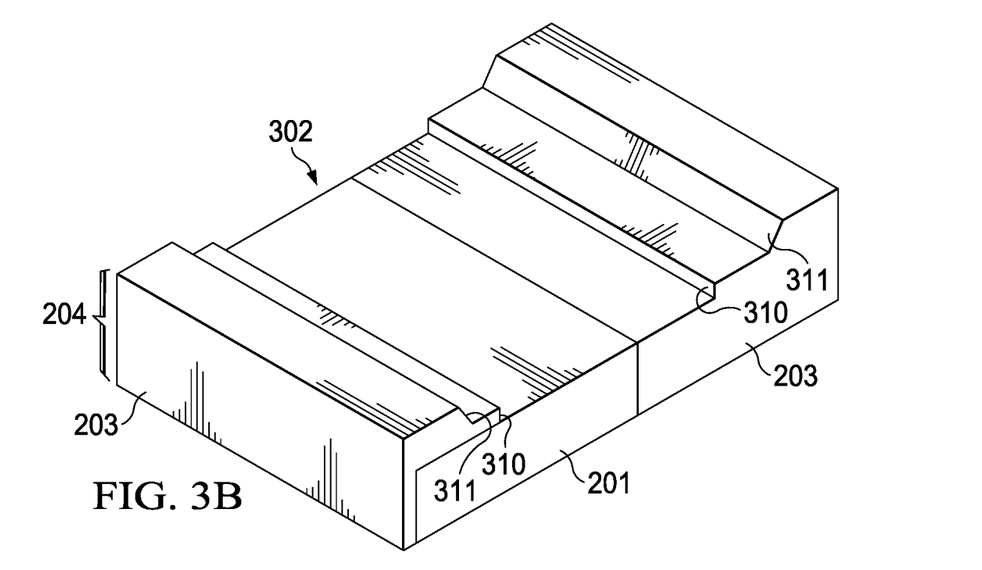

FIGS. 3B and 3BB show, in a projection view and a cross section, respectively, the thermal pad 201 with a first mold compound portion 203 in a pre-molded package substrate 204. The pre-molded package substrate 204 can be formed in a transfer molding operation, using a high coefficient of thermal expansion (CTE) mold compound, for example, for mold compound 203. The recess 302 can be formed in the mold compound 203 as shown, or can have different shapes, for example more ledges 310 or fewer ledges, the ledges may have rounded corners or sharp corners. While the recess 302 is in this example has ledges 310 on two sides, in an alternative the recess 302 may be a cavity with ledges on four sides. A sloped surface 311 in the mold compound extends from a planar exterior surface of the pre-molded package substrate 301 to the ledge 310. This sloped surface 311 can vary in slope, or can be another shape. The recess 302 exposes a portion of the thermal pad 201 from mold compound 203 and enables one or more semiconductor dies to be mounted directly to the surface of the thermal pad, enhancing thermal dissipation from the semiconductor die or dies. The ledges 310 provide a planar surface for a trace (shown below) to be mounted, the traces will receive a bond wire ball or stitch, or a wedge or ribbon bond connection, during the bonding process. The pre-molded package substrate 204 has a thickness T2 that is greater than the thickness T1 of the thermal pad 201, the mold compound 203 partially covers and contains the thermal pad 201. In examples the thickness T2 (which corresponds to the total package thickness in the completed device as shown below) ranges from 0.8-3.5 millimeters. The mold compound 203 partially covers the thermal pad 201 and at least the bottom surface (as oriented in FIG. 3BB, for example) of the thermal pad 201 is exposed for thermal dissipation away from the packaged device. The vertical sides of the thermal pad 201 may be exposed from the mold compound 203 or may be covered by mold compound 203.

Figure 3C:
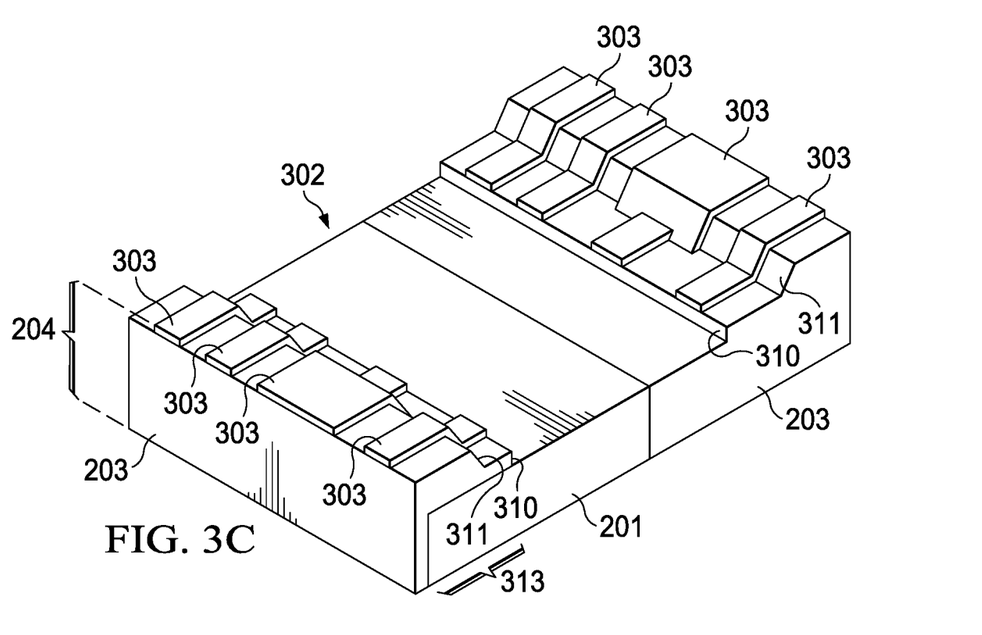

FIGS. 3C and 3CC are a projection view and a cross section, respectively, which show the pre-molded package substrate 204 after conductive traces 303 are formed over the mold compound 203. In an example process, the traces 303 can be formed using a plating method such as sputtering a seed layer over the pre-molded package substrate 204, using photolithography to expose the seed layer in patterned photoresist, plating the traces 303, and then removing the photoresist and unused seed layer material. Electroplating or electroless plating techniques can be used. The traces 303 form conformally on the mold compound 203 including on ledges 310, and are formed with interior ends adjacent the recess 302. Alternative approaches include using foils or lead frame technology to form metal leads that are placed on a matrix of the pre-molded package substrates. Etching, grinding, or laser cutting can be used to form the traces. 3D printing can be used. The bottom of the recess 302 has a planar surface in a first plane, the ledges 310 have a planar surface in a second plane spaced from the first plane, and the mold compound 203 has a planar exterior surface that forms the die side surface of the packaged device in a third plane spaced from the second plane. The traces 303 form on the mold compound 203, over and on ledges 310 and conform to the mold compound 203 including the sloping surface 311 from the recess 302 extending to the second plane of the ledges 310. In region 313, the thermal pad 201 has a portion lying under the traces 303 (as oriented in FIG. 3C), which can further increase thermal dissipation, this is of particular significance for signal traces carrying high current where heating can occur.

Figure 3D:
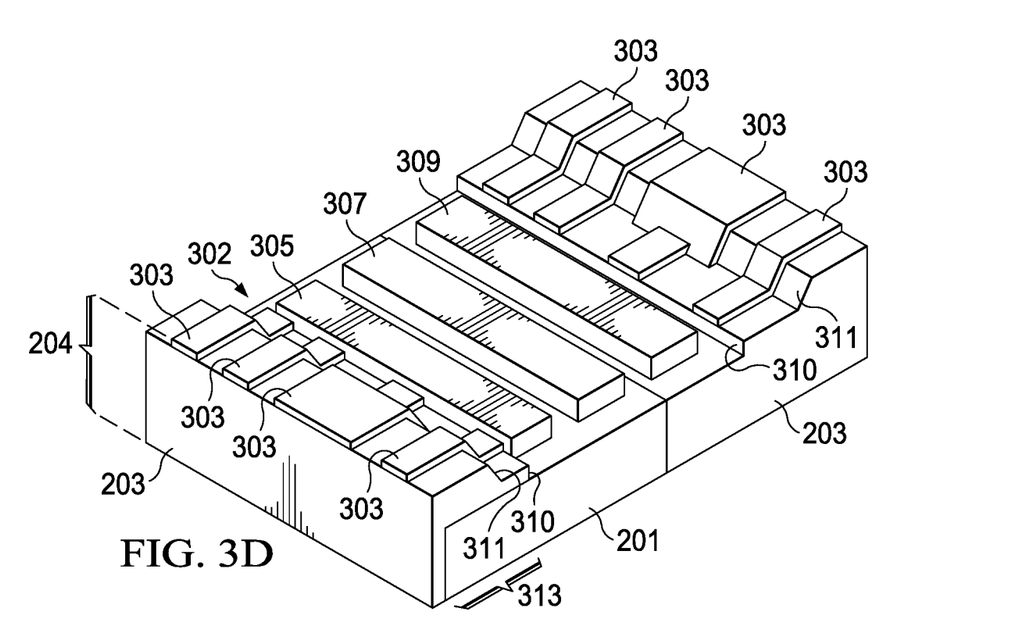

FIG. 3D illustrates in a projection view the pre-molded package substrate 204 and semiconductor dies mounted to the die side surface of the package substrate 204 and thermal pad 201. The semiconductor dies may be different from one another and may have different functions to form a power circuit, for example die 305 may be a power FET transistor such as a GaN FET, die 307 may be a gate driver for the power FET transistor, die 309 may be a logic device, for example a controller, or may be a passive device, for example die 309 may provide capacitors, resistors, or inductors. In FIG. 3D two dies, the power device 305 and the gate driver 307, are mounted on thermal pad 201 using a die attach which is both thermally conductive and which electrically connects the bodies of the semiconductor devices to the thermal pad 201. These semiconductor dies carry substantial current and may be considered "hot" devices, devices that in operation generate substantial heat. The third die 309 is mounted on the mold compound 203, is electrically isolated from the power devices 305 and 307, and is thermally isolated from the power devices 305 and 307. In some examples semiconductor die 309 may be a logic device, controller, or a passive component and may not carry substantial current, and may be considered a "cool" device which does not require thermal dissipation from the thermal pad 201. In the example of FIG. 3D, the two semiconductor dies 305, 307, are mounted to a conductive copper thermal pad 201, and the bodies of the two semiconductor dies are electrically coupled, and thermal pad 201 can be grounded, for example. In contrast, semiconductor die 309 is electrically isolated from the two semiconductor dies 305, 307 as it is mounted on mold compound 203 in the recess 302, and is electrically insulated from the thermal pad 201. The pre-molded package substrate 204 therefore allows electrical isolation between components, which is needed for some power circuits.

Figure 3E:
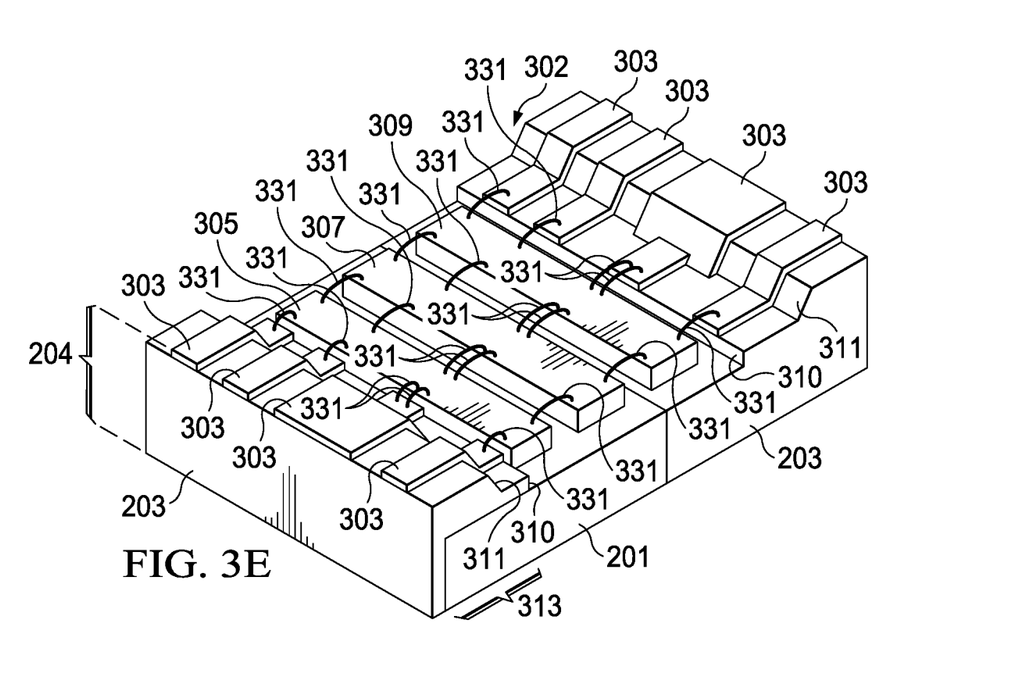

FIG. 3E illustrates in a cross sectional view the pre-molded package substrate 204 after the dies 305, 307, and 309 are electrically connected to one another and to the traces 303 by wire bonds 331. In an alternative, ribbon bonds can be used, and combinations of these can be used. Wire bonds are convenient electrical connections because if there are any device alignment issues, the wire bonds can still efficiently connect bond pads on the dies to the traces 303 or to the other dies. Wires for the wire bonds can be gold, aluminum, copper, plated copper, palladium coated copper (PCC), silver, silver-gold alloy or other bond wire materials used in semiconductor packaging. For signals with large current requirements, multiple connections such as multiple wire bonds can be formed in parallel to reduce resistance and increase carrying capacity. In some power circuits, electrical isolation is required across a circuit function, and some devices are to be maintained at different ground or supply voltages, for example. Because semiconductor die 309 is mounted on mold compound 203, which is an insulator, it is electrically insulated from semiconductor dies 305, 307 and thermal pad 201. This isolation of devices from one another within a single package is an important feature of the package in many applications for power devices.

Figure 3F:
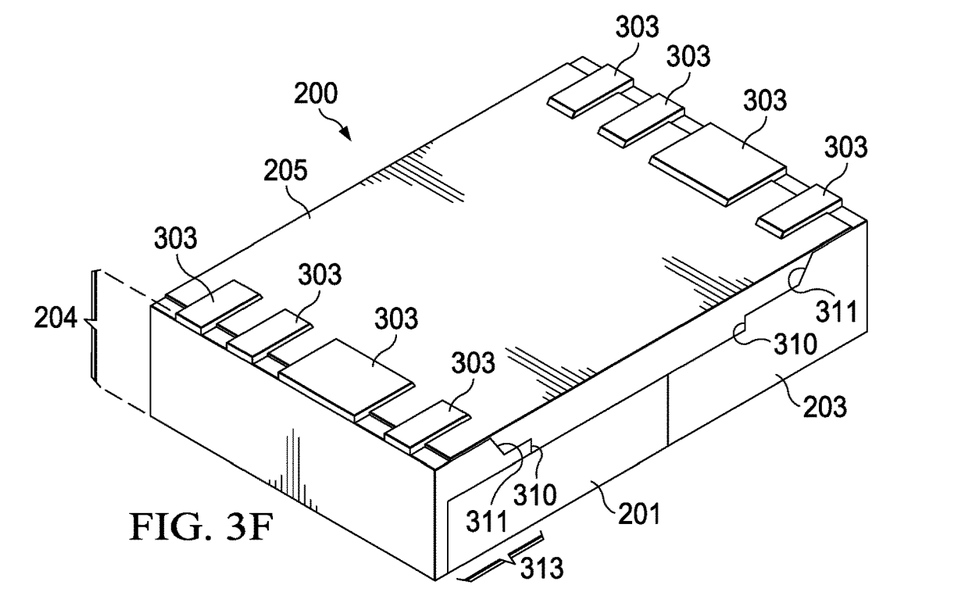

FIG. 3F shows packaged device 200 after a second mold compound 205 is used to cover the recess, the semiconductor dies, the bond wires, the die pad portion of the thermal pad 201 and portions of the traces 303, leaving portions of traces 303 exposed to form terminals for the packaged device 200. The second mold compound 205 can be another high CTE mold compound material and can be deposited using a transfer mold process, injection, drop on demand or ink-jet deposition, or other deposition methods. In some examples the second mold compound 205 can be of the same material as first mold compound 203 of the pre-molded package substrate 204. Alternatively a different mold compound material can be used for the second mold compound 205.

Figure 3G:
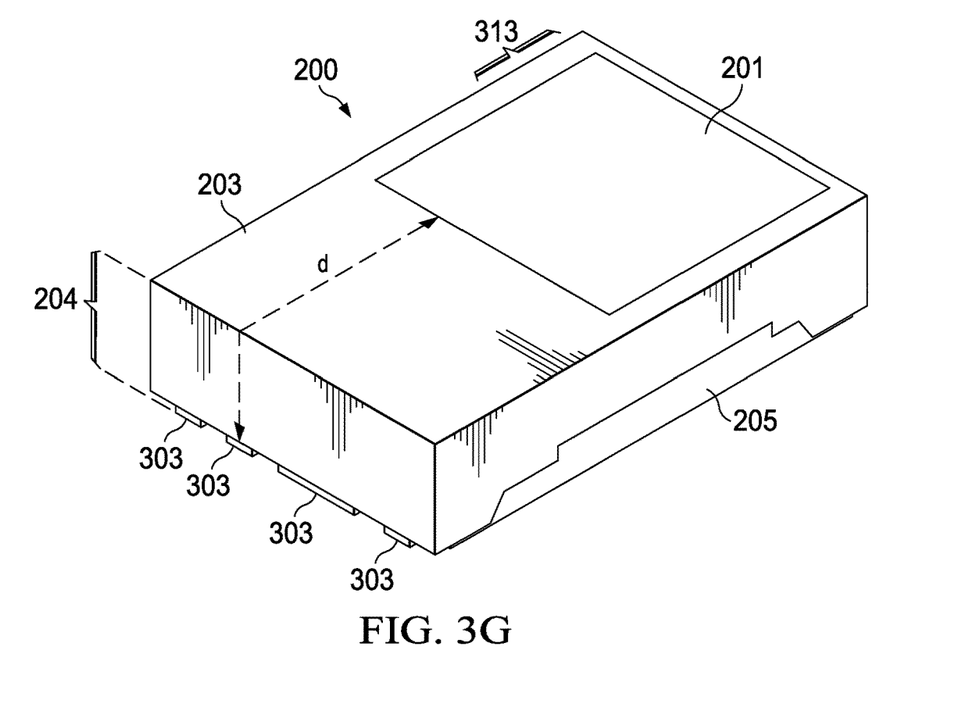

FIG. 3G illustrates the package 200 viewed from the backside surface. The backside of thermal pad 201 is exposed and can be used to mount a heat sink or fin, and can be used to dissipate thermal energy out of the package using convection, forced air, or liquid cooling. A significant feature of the arrangements is that the "creep age distance" labeled "d" is enhanced over prior packages. The creepage distance d is a distance from the edge of the thermal pad 201 to another metal feature that is electrically isolated from the thermal pad; that is, d is the minimum distance from a conductor at the high voltage to a conductor at a lower voltage. When the terminals carry high voltages, arcing and shorting can occur between surfaces if the spacing is too small. Because the thermal pad 201 is only exposed from the mold compound about halfway across the backside of the package 200, the creepage distance d is maintained at a substantial distance in the arrangements. A distance d from about 2 millimeters to 8 millimeters is useful in example arrangements, or larger.

Figure 3H:
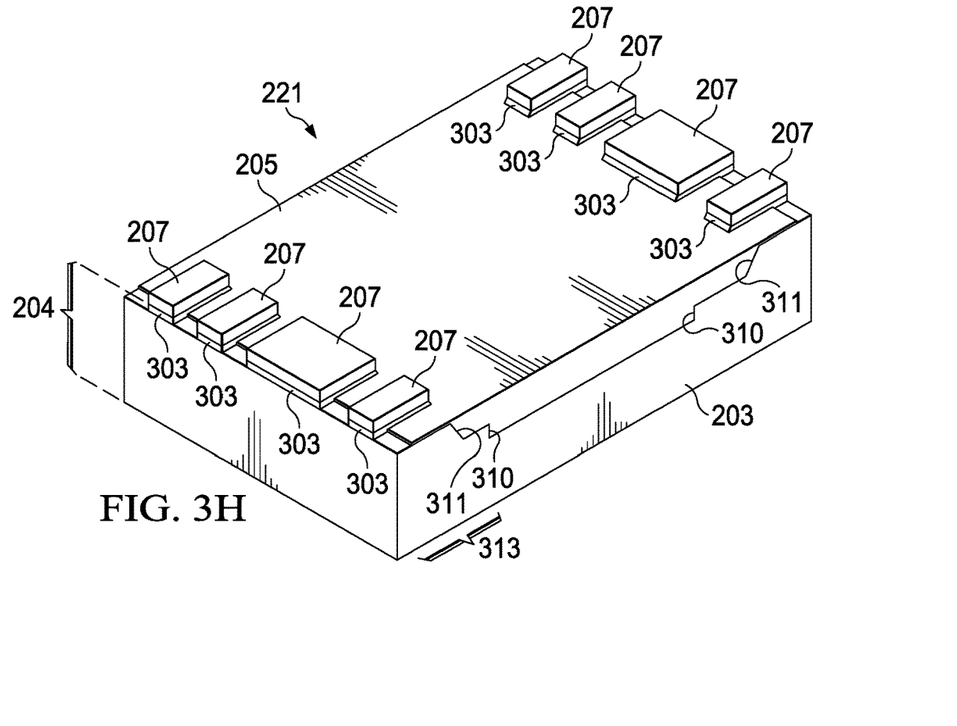

FIG. 3H illustrates another arrangement for a completed packaged device 221 after the exposed portions of traces 303 are plated to form terminals 207. The platings can include platings to increase solderablilty for SMT mounting, reduce corrosion, and/or to prevent ion diffusion from copper traces, for example. Useful platings include ENIG and ENEPIG, nickel, gold, palladium, silver, and tin. The die side surface of pre-molded package substrate 204 is covered in part by the second mold compound 205 to complete the packaged device 221, while the terminals 207 remain exposed from the second mold compound 205. When the packaged device 221 is mounted to a system board or module, the terminals 207 will be soldered to the board. In FIG. 3H, the sides of the thermal pad 201 (see FIG. 3F) are covered by mold compound and so are not visible in FIG. 3H, in this example only the backside surface of thermal pad 201 is exposed, while in other examples (see FIG. 3F) some sides of the thermal pad 201 are also exposed to provide additional thermal dissipation.

Figure 4:
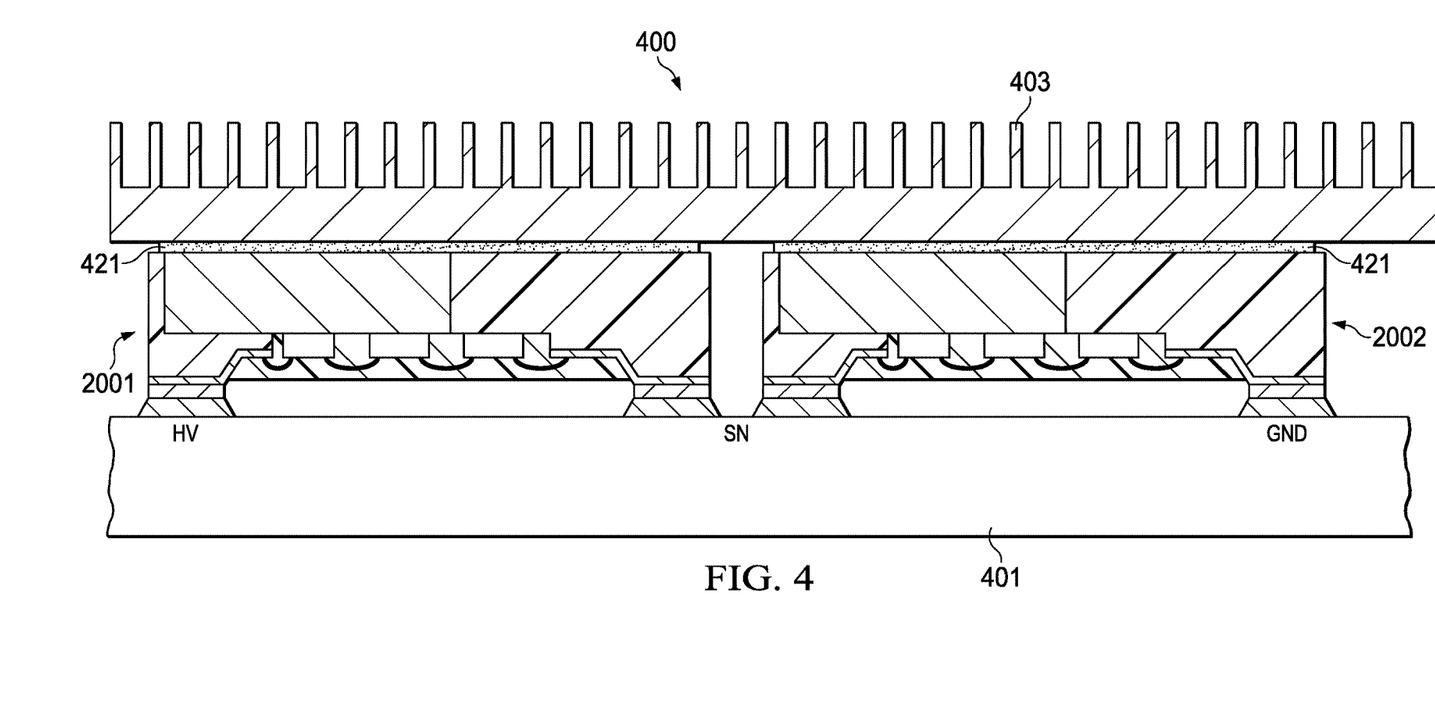
FIG. 4 illustrates in a cross section a module that uses two of the packaged devices to form a circuit.

FIG. 4 illustrates in a cross section a module or system 400 that uses two of the packaged devices of the arrangements, labeled 2001 and 2002, together to form a power circuit. In FIG. 4, the two packaged devices 2001, 2002 are surface mounted to a printed circuit board 401 and may be coupled together by conductors and traces in the board 401 (not shown for simplicity of illustration) to form a half bridge circuit, for example, with one packaged device 2001 forming a high side circuit, including a power transistor device coupled between a high voltage "HV" and a switching node "SN", and the second packaged device 2002 forming a low side circuit, including a power transistor device coupled between the switching node SN and ground "GND." Other circuits can be formed such as a full bridge circuit. The module 400 includes a heat sink 403 that is attached to the exposed portions of the thermal pad for each of the packaged devices 2001 and 2002 by a thermally conductive material 421, for example a thermally conducting adhesive, by a tape or by a ceramic material. The material 421 is an electric insulator. The heat sink 403 is thermally coupled and electrically isolated from both packaged devices 2001, 2002 to improve performance. Additional cooling such as convection or forced air, liquid cooling, or other cooling methods can be applied to the module 400 to further increase thermal performance. The high voltage node HV can be coupled to a voltage that ranges from tens, to hundreds, or thousands of volts. In an example, a high voltage HV of 600 Volts is used. The board 401 provides vias and conductors to couple the switch node terminals at node SN from both packaged devices 2001 and 2002 together.

Figure 5A:
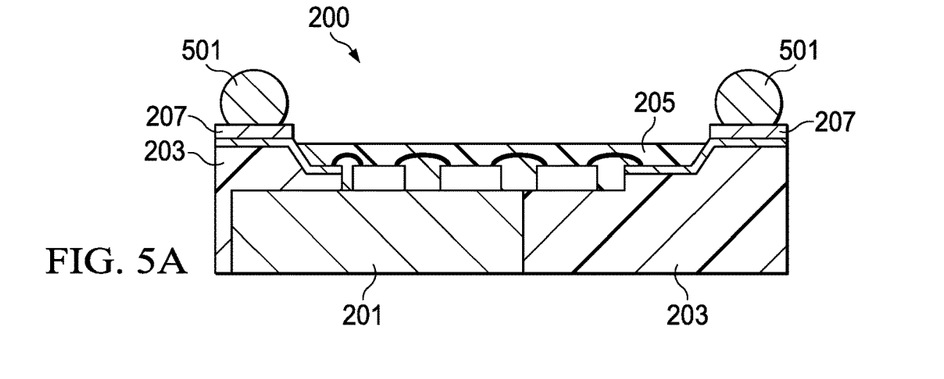
FIGS. 5A-5D illustrate in cross sectional views alternative arrangements for the packaged semiconductor device.

FIGS. 5A-5D illustrate in cross sectional views alternative arrangements for packaged devices. In FIG. 5A, the packaged device 200, of FIG. 2A, is shown in cross section with thermal pad 201. First mold compound 203 partially covers thermal pad 201 which is exposed at the backside surface (bottom surface as oriented in FIG. 5A) and in the recess on the die side surface. Semiconductor devices are mounted on the thermal pad 201 and on the first mold compound 203 in the recess. A second mold compound 205 is used to cover the semiconductor dies and the wire bonds as described above. Terminals 207 are exposed from the mold compounds to form SMT connections for the package 200. In the example of FIG. 5A additional solder 501 is shown on the terminals 207, this additional plating of solder can facilitate later SMT mounting to a board.

Figure 5B:
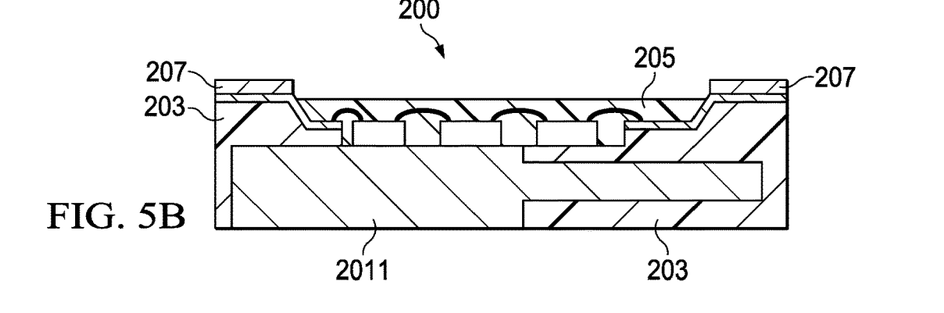

In FIG. 5B, a modified shaped thermal pad is shown as 2011, modified from 201 in FIG. 5A, to increase the thermal performance by extending a portion of the thermal pad 2011 beneath the traces and the electrically isolated semiconductor die mounted on the mold compound 203.

Figure 5C:
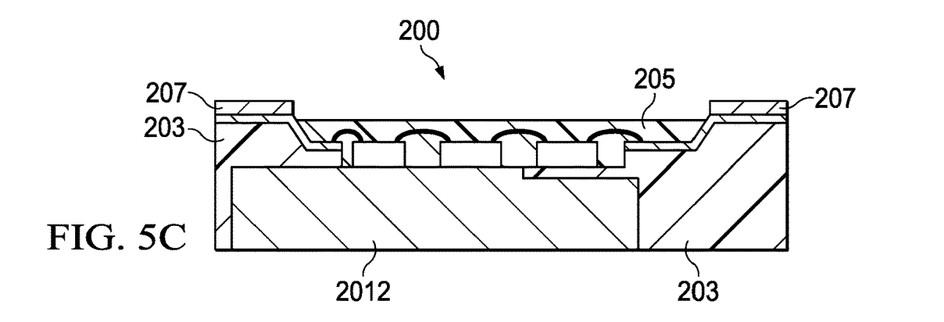

In FIG. 5C, in yet another arrangement, a thermal pad 2012 is modified in another shape to extend under the die that is mounted on the mold compound, and electrically insulated from the semiconductor die by mold compound 203.

Figure 5D:
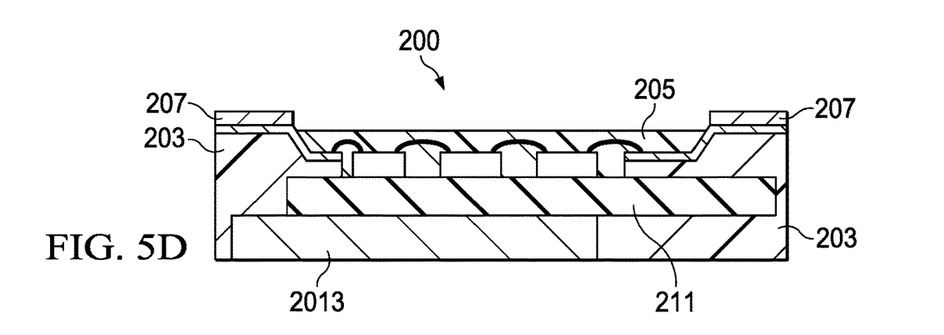

FIG. 5D illustrates another arrangement where the thermal pad 201 is insulated electrically from all of the semiconductor dies by mounting an additional thermally conductive and electrically insulating material 211, which can be a ceramic thermal pad. The ceramic thermal pad 211 is a second thermal pad attached and thermally coupled to the first thermal pad 2013, which can be a thinner copper thermal pad (when compared to thermal pad 201 in FIG. 5A). In FIG. 5D, the semiconductor devices are electrically isolated from one another and from the thermal pad 2013, because the ceramic thermal pad 211 is an electrical insulator. The ceramic thermal pad outperforms mold compound for thermal transfer, so that the packaged device 200 in FIG. 5D has better thermal performance and also provides electrical isolation between all of the devices when compared to prior approaches.

Figure 6A:
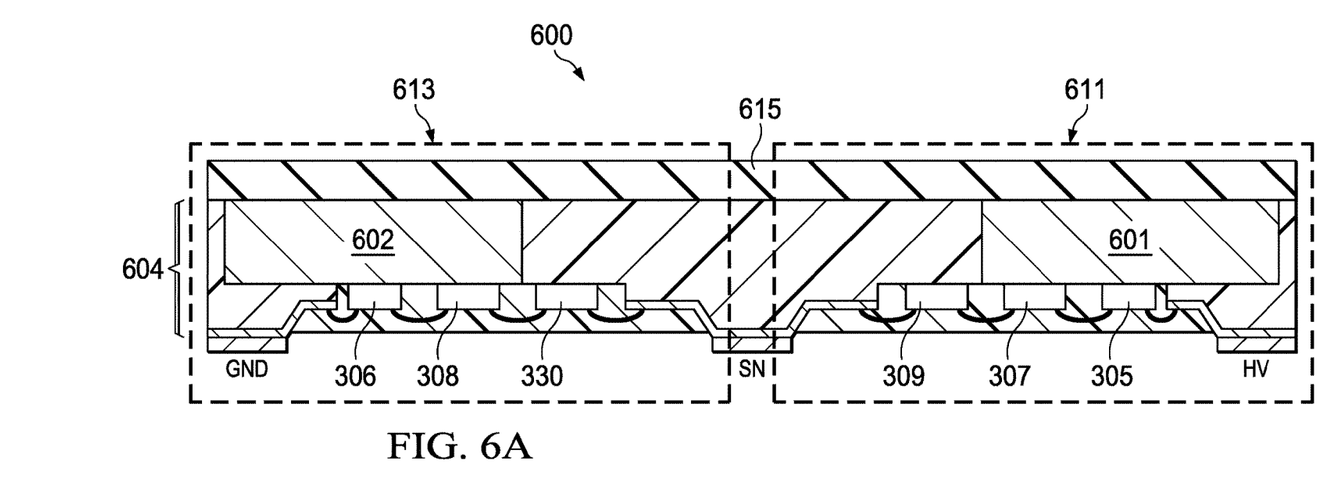
FIGS. 6A and 6B illustrate an arrangement with two power circuits packaged together in a single packaged device.
Figure 6B:
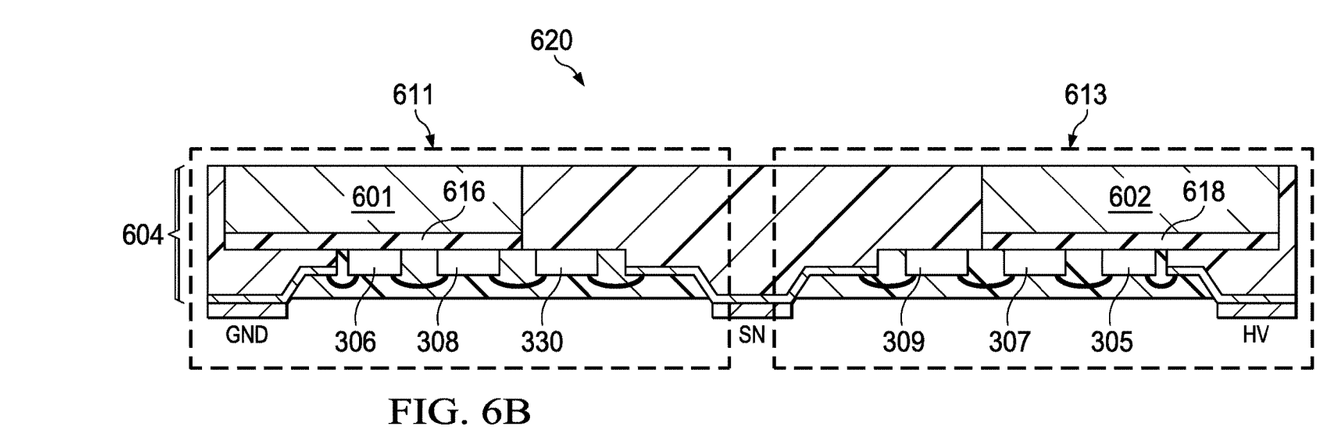

FIGS. 6A and 6B illustrate an arrangement where two driver circuits such as a high side and low side driver are packaged together in a single packaged device 600. In an example the device 600 provides the same functional circuit as the system 400 in FIG. 4, while requiring fewer connections in the system board, and less board area. In FIG. 6A, a first power FET die 305, a first gate driver die 307, and a first passive device 309 are mounted to form a high side driver 611 on a pre-molded substrate 604 with a first thermal pad 601. The high side driver 611 is coupled between a high voltage terminal HV and a switch node terminal SN. The pre-molded package substrate 604 also carries a low side driver 613 coupled between the switch node terminal SN and a ground terminal GND that includes a second power FET die 306, a second gate driver 308, and a second passive device 330, the second power FET die 306 and the second gate driver 308 mounted to the second thermal pad 602. A ceramic thermal pad 615 is mounted on the backside surface of the pre-molded package substrate 604 to thermally couple the thermal pads 601, 602 to the ambient, while electrically insulating the two driver circuits from each other. Suitable ceramic thermal pad materials include alumina nitride (AlN) and silicon nitride ($Si_3N_4$) ceramics. Other thermally conductive and electrically insulating materials can be used. The packaged device 600 is an integrated half bridge circuit with the connections between the devices completed within the package, saving board area on the system board when compared to the arrangement in FIG. 4.

FIG. 6B illustrates in another cross section a packaged device 620 including a ceramic thermal pad between the semiconductor dies and the metal thermal pads. In this arrangement, the semiconductor dies are electrically isolated from one another. Pre-molded package substrate 604 includes in a low side circuit portion 611 a first ceramic thermal pad 616 and a first metal thermal pad 601, while the high side driver portion 613 includes a second ceramic thermal pad 618 and a second metal thermal pad 602. A heat spreader can be mounted on the backside surface of the package 620 and because of the use of the ceramic thermal pads 616, 618, the heat sink will be electrically insulated from the semiconductor devices, which are also isolated from the metal thermal pads by the ceramic thermal pads 616, 618.

Figure 7:
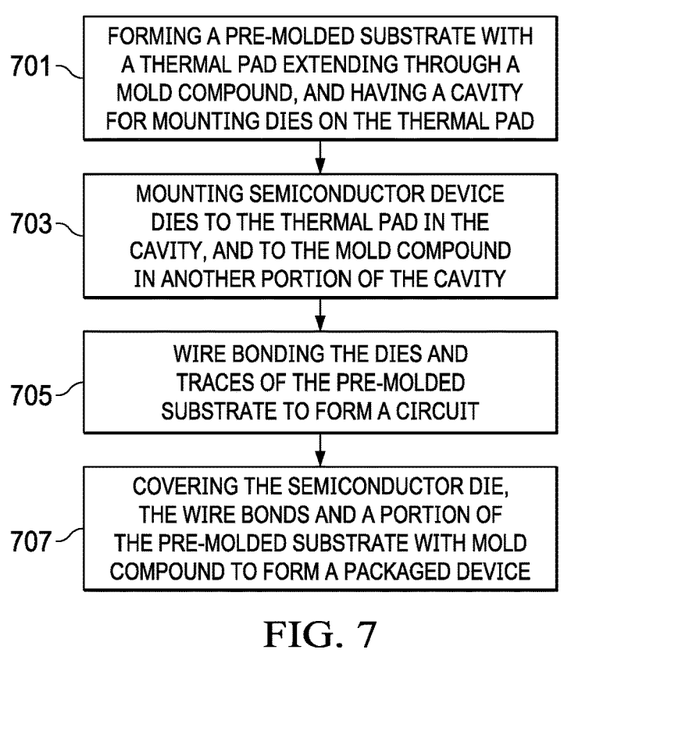
FIG. 7 is a flow diagram illustrating a method.

FIG. 7 is a flow diagram illustrating a method. At step 701, a pre-molded substrate is formed with a thermal pad partially extending through a mold compound, the pre-molded package substrate having a recess on a die side surface of the pre-molded substrate, the recess having a die mounting area on the surface of the thermal pad and on a portion of the mold compound. At step 703, semiconductor dies are mounted in the recess on the portion of the thermal pad in the die mounting area, and on the portion of the mold compound in the die mounting area. At step 705, wire bonding is used to connect the semiconductor dies to traces on the pre-molded package substrate. At step 707, the semiconductor dies, the wire bonds, and the cavity and portions of the traces on the pre-molded package substrate are covered with mold compound to form a packaged device.

Modifications are possible in the described arrangements, and other alternative arrangements are possible within the scope of the claims.

What is claimed is:

1. An apparatus, comprising:
a first mold compound partially covering a thermal pad that extends through a pre-molded package substrate formed of a first mold compound, the thermal pad having an exposed surface on a backside surface of the pre-molded package substrate, a portion of the thermal pad exposed on a die side surface of the pre-molded package substrate opposite the backside surface, the pre-molded package substrate having a recess on the die side surface, with an exposed portion of the thermal pad and a portion of the first mold compound in a die mounting area in the recess;
a semiconductor die mounted to the thermal pad and another semiconductor die mounted to the mold compound in the die mounting area;
conductive traces overlying the mold compound on the die side surface of the pre-molded package substrate and spaced from the recess;
wire bonds coupling bond pads on the semiconductor dies to the traces; and
a second mold compound over the die side surface of the pre-molded package substrate and covering the wire bonds, the semiconductor dies, the recess, and a portion of the traces.

2. The apparatus of claim 1, wherein the thermal pad is a first thermal pad of a metal, and further comprising a second thermal pad of a ceramic in thermal contact to the first thermal pad and mounted in the pre-molded package substrate.

3. The apparatus of claim 1, wherein the thermal pad is of an electrically conductive metal.

4. The apparatus of claim 3, wherein the thermal pad comprises copper.

5. The apparatus of claim 4, wherein the copper thermal pad is a first thermal pad, and further comprising a second thermal pad of a ceramic attached to the first thermal pad.

6. The apparatus of claim 1, wherein the first thermal pad has an extended portion that extends beneath the semiconductor die mounted on the mold compound in the recess, the extended portion spaced from the semiconductor die by the first mold compound.

7. The apparatus of claim 1, wherein the thermal pad is a first thermal pad of a ceramic material, and further comprising a second thermal pad mounted to a backside surface of the ceramic material, and the second thermal pad is a conductive metal.

8. The apparatus of claim 7, wherein the first thermal pad is of a material that is selected from alumina, aluminum nitride, and silicon nitride.

9. The apparatus of claim 7, wherein the second thermal pad is of a material that is selected from copper, aluminum, Alloy 42, nickel, steel and stainless steel.

10. The apparatus of claim 1, wherein the thermal pad has vertical sides exposed from the mold compound of the pre-molded package substrate.

11. The apparatus of claim 1, and further comprising a heat sink attached to the backside surface of the pre-molded package substrate and in thermal contact with the backside surface of the thermal pad.

12. An apparatus, comprising:
a pre-molded package substrate, comprising:
a first thermal pad partially covered by a first mold compound and having a backside surface exposed from the first mold compound on a backside surface of the pre-molded package substrate, and having a die side surface opposite the backside surface exposed from the first mold compound in a first recess in the pre-molded package substrate;
a second thermal pad spaced from the first thermal pad, the second thermal pad partially covered by the first mold compound having a backside surface exposed from the first mold compound on the backside surface of the pre-molded package substrate, and having a die side surface opposite the backside surface and exposed from the first mold compound in a second recess in the pre-molded package substrate, the second recess spaced from the first recess;
a high side driver circuit coupled between a high voltage terminal for receiving a high voltage and a switching node terminal for a switch node, the high side driver circuit comprising a first FET semiconductor die mounted to the die side surface of the first thermal pad in the first recess of the pre-molded package substrate;
a low side driver circuit coupled between the switching node terminal and a ground terminal for a ground voltage, the low side driver circuit comprising a second FET semiconductor die mounted to the die side surface of the second thermal pad in the second recess of the pre-molded package substrate;
bond wires coupling the high side driver circuit to the high voltage terminal and to the switching node terminal, and coupling the low side driver circuit to the switching node terminal and the ground terminal; and
a second mold compound in the first recess and the second recess, the second mold compound covering the high side driver circuit in the first recess and covering the low side driver circuit in the second recess.

13. The apparatus of claim 12, wherein the high side driver circuit further comprises: a first gate driver semiconductor die coupled to the first FET semiconductor die and a first passive component, the first FET semiconductor die and the gate driver semiconductor die mounted to the die side surface of the first thermal pad in the first recess, and the passive component mounted on the first mold compound in the first recess.

14. The apparatus of claim 12, wherein the low side driver circuit further comprises: a second gate driver semiconductor die coupled to the second FET semiconductor die and to a second passive component, the second FET semiconductor die and the second gate driver semiconductor die mounted to the die side surface of the second thermal pad in the second recess, and the second passive component mounted on the first mold compound in the second recess.

15. The apparatus of claim 12, wherein the first thermal pad and the second thermal pad comprise a conductive metal.

16. The apparatus of claim 12, and further comprising a ceramic thermal pad mounted to the backside surface of the pre-molded package substrate, the ceramic thermal pad in thermal contact with the first thermal pad and the second thermal pad, and the ceramic thermal pad being an electrical insulator.

17. The apparatus of claim 12, and further comprising a first ceramic thermal pad between the first recess and the first thermal pad, and insulating the first FET semiconductor die from the first thermal pad.

18. The apparatus of claim 17 and further comprising a second ceramic thermal pad between the second recess and the second thermal pad, and insulating the second FET from the second thermal pad.

19. A method, comprising:
- forming a pre-molded package substrate with a thermal pad partially extending through a first mold compound, forming a recess on a die side surface of the pre-molded substrate, and having a die mounting area on the a surface of the thermal pad exposed from the first mold compound in the recess and on a portion of the first mold compound in the recess;
- mounting semiconductor dies in the recess and on the thermal pad in the die mounting area, and on the portion of the first mold compound in the die mounting area;
- forming wire bond connections to traces overlying the mold compound on the die side surface of the pre-molded substrate; and
- covering the semiconductor dies, the wire bonds, the recess and portions of the traces on the pre-molded substrate with mold compound.

20. The method of claim 19, and further comprising mounting a heat sink on a backside surface of the pre-molded package substrate opposite the die side surface, the heat sink in thermal contact with a backside surface of the thermal pad exposed from the mold compound on the backside surface of the pre-molded package substrate.

\* \* \* \* \*